United States Patent
Morinari

(10) Patent No.: US 9,048,556 B2
(45) Date of Patent: Jun. 2, 2015

(54) ELECTRIC CONTACT PIN AND SOCKET FOR ELECTRICAL PARTS

(71) Applicant: ENPLAS CORPORATION, Kawaguchi (JP)

(72) Inventor: Takashi Morinari, Saitama (JP)

(73) Assignee: EMPLAS CORPORATION, Saitama (JP)

( * ) Notice: Subject to any disclaimer, the term of this patent is extended or adjusted under 35 U.S.C. 154(b) by 59 days.

(21) Appl. No.: 13/983,735

(22) PCT Filed: Dec. 27, 2012

(86) PCT No.: PCT/JP2012/083911
§ 371 (c)(1),
(2) Date: Aug. 5, 2013

(87) PCT Pub. No.: WO2013/100064
PCT Pub. Date: Jul. 4, 2013

(65) Prior Publication Data
US 2014/0057500 A1    Feb. 27, 2014

(30) Foreign Application Priority Data

Dec. 29, 2011  (JP) .................................. 2011-290363

(51) Int. Cl.
*H01R 13/24* (2006.01)
*G01R 1/04* (2006.01)
(Continued)

(52) U.S. Cl.
CPC .......... *H01R 13/2421* (2013.01); *G01R 1/0466* (2013.01); *G01R 1/0483* (2013.01); *G01R 1/06722* (2013.01); *H01R 12/714* (2013.01)

(58) Field of Classification Search
CPC ........... H01R 13/2421; H01R 13/2428; H01R 33/46; H01R 23/722; H01R 2201/20

USPC ........ 439/700, 482, 824, 264, 268, 525, 526, 439/66
See application file for complete search history.

(56) References Cited

U.S. PATENT DOCUMENTS

| 6,323,667 | B1  | 11/2001 | Kazama |
| 8,523,579 | B2* | 9/2013  | Johnston et al. ................ 439/66 |

(Continued)

FOREIGN PATENT DOCUMENTS

| JP | 10-239349 | 9/1998 |
| JP | 10-312845 | 11/1998 |

(Continued)

OTHER PUBLICATIONS

International Preliminary Report of Patentability issued Jul. 1, 2014 in corresponding International Patent Application No. PCT/JP2012/083911.

(Continued)

*Primary Examiner* — Abdullah Riyami
*Assistant Examiner* — Thang Nguyen
(74) *Attorney, Agent, or Firm* — Staas & Halsey LLP

(57) ABSTRACT

A electric contact pin which can certainly contact a plunger with a contact spring and ensure smooth operation (vertical motion) of the plunger. The present invention can execute electrical tests of the electrical parts accurately. The electric contact pin according to the present invention contacts an eccentrical portion of an open coil portion provided for the contact spring capable of easily deforming in a radial direction with a conductive portion of the plunger. Consequently, the conductive portion of the plunger is elastically pinched between the eccentrical portion of the open coil portion and the closed coil portion. The eccentrical portion of the open coil portion and the closed coil portion are contact with the conductive portion of the plunger at any time.

7 Claims, 10 Drawing Sheets

(51) Int. Cl.
*G01R 1/067* (2006.01)
*H01R 12/71* (2011.01)

(56) References Cited

U.S. PATENT DOCUMENTS 8,669,774 B2 * 3/2014 Kato et al. ............... 324/755.05
2005/0266734 A1 * 12/2005 Kazama ........................ 439/700

FOREIGN PATENT DOCUMENTS

| JP | 20090244672 | * 10/2009 | ............ G01R 1/067 |
|---|---|---|---|
| JP | 2011-89930 | 5/2011 | |
| WO | WO 98/29751 | 7/1998 | |
| WO | 2006/007440 | 1/2006 | |
| WO | 2011/048890 A1 | 8/2011 | |

OTHER PUBLICATIONS

International Search Report mailed Apr. 16, 2013 for corresponding International Application No. PCT/JP2012/083911.

* cited by examiner

FIG.6
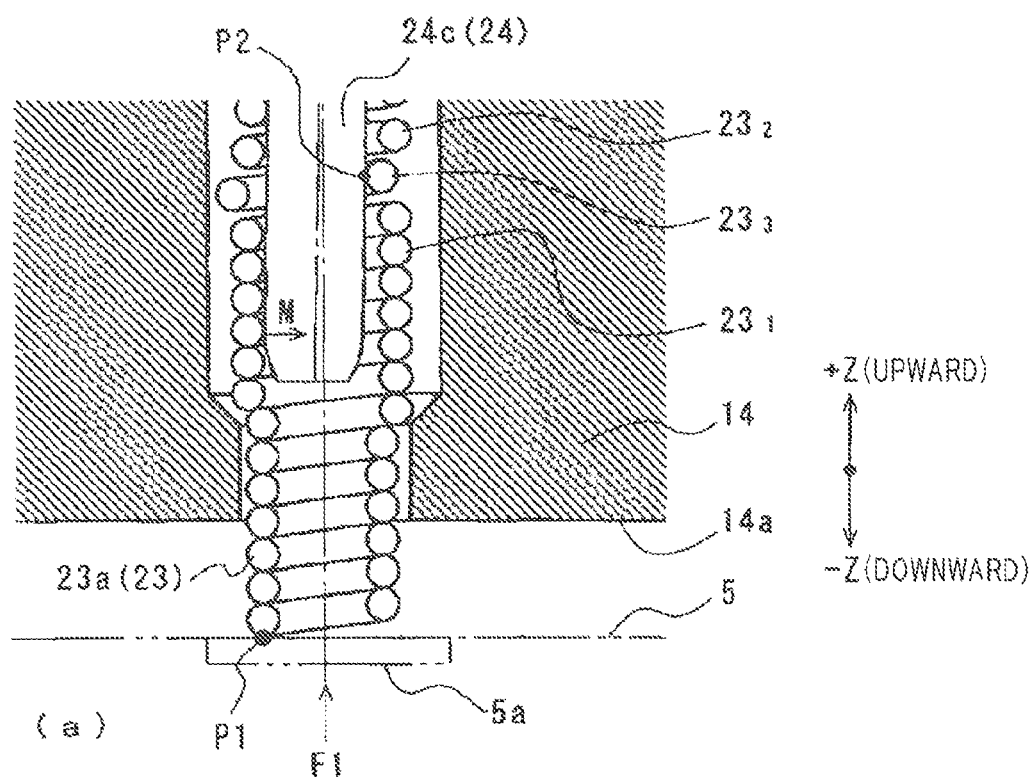
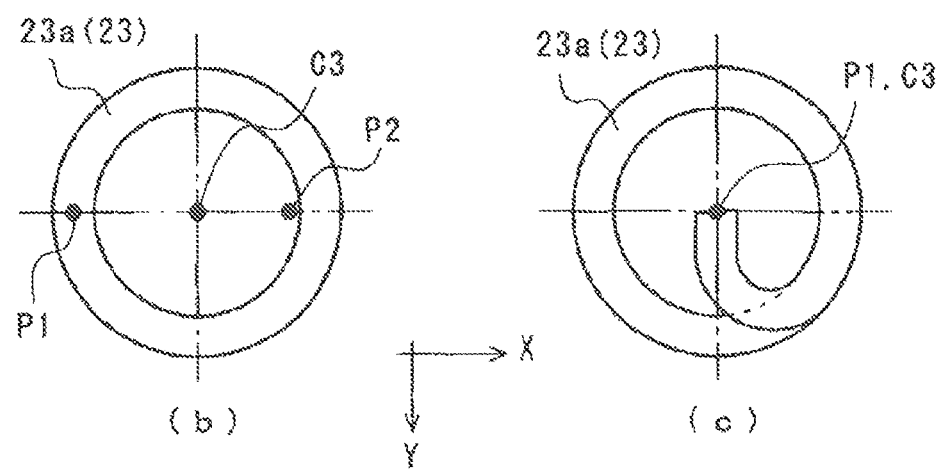

(a)

(b)

ELECTRIC CONTACT PIN AND SOCKET FOR ELECTRICAL PARTS

CROSS-REFERENCE TO RELATED APPLICATIONS

This application is a US National Stage application of PCT Application No. JP2012/083911 filed Dec. 27, 2012, and claims foreign priority to Japanese Application No. 2011-290363 filed Dec. 29, 2011, the contents of which are incorporated herein by reference.

FIELD OF THE INVENTION

The present invention relates to a socket for electrical parts used for electrically connecting an electrical part (e.g. an IC package) with an external electric circuit, and an electric contact pin provided for the socket for electrical parts.

BACKGROUND ART

Conventionally, there is known a socket for electrical parts which is configured so as to hold an IC package to be attachable and detachable in an IC package accommodation portion on a socket body, and electrically connect terminals formed on a lower surface of the IC package with the external electric circuit (e.g. an electric circuit board for an electric test of the IC package) using contact pins (e.g. probe pins) accommodated in the socket body (refer to the patent document 1 described below).

PRIOR ART DOCUMENT

Patent Document patent document 1: Japanese Patent Laid-open Publication No. 2011-89930

SUMMARY OF THE INVENTION

Problems to be Solved by the Invention

However, the probe pin described on the patent document 1 have a possibility that a plunger become not be able to move up and down smoothly. In addition, the socket for electrical parts provided with the plural number of such probe pins has possibilities that contact pressures with the terminals of the IC package vary widely by each probe pin, as a result, the electric test et al of the IC package become unreliable, or that some bad connections between the terminals 113 of the IC package 103 and probe pins 102 occur, as a result, the electrical test become to be impossible.

The present invention has been made in view of the background art as described above, and it is an object thereof to provide an electrical contact pin in which a plunger certainly contacts with a contact spring and ensure smooth operations (i.e. vertical motions), as a result, to execute an electric test et al. of an electrical part accurately.

Means to Solve the Problem

The first aspect of the present invention relates to an electric contact pin accommodated in a socket for electrical parts to electrically connect a terminal of an electrical part with a terminal of an external electric circuit, comprising; a contact spring that is in a shape of a coil and is contacted with the terminal of the external electric circuit, and a plunger that is biased by the contact spring to contact with the terminal of the electrical part, wherein the contact spring comprises; a closed coil portion that contacts with the terminal of the external electric circuit, and an open coil portion that elastically supports the plunger, the plunger comprises; a flange portion that is configured so as to slide in a pin accommodation hole under a state the plunger is elastically supported by the contact spring, a terminal contact portion that extends from the one end surface of the flange portion, project to an outside of the pin accommodation hole and contact a top end of itself with the terminal of the electrical part, a conductive portion that is in a shape of a rod and extends from the other end surface of the flange portion to be inserted into an inner side of the contact spring, the open coil portion comprises an eccentrical portion having at least one eccentrical roll, the eccentrical portion of the open coil portion and the closed coil portion are configured so as to elastically pinch the conductive portion of the plunger in a radical direction of the plunger and contact with the conductive portion of the plunger at any time.

It is preferable for the electric contact pin of the present invention that the eccentrical portion of the contact spring contains plural eccentrical rolls and eccentrical measurements of the eccentrical rolls increase gradually by each roll.

It is preferable for the electric contact pin of the present invention that the closed coil portion of the contact spring has a contact portion to contact with the terminal of the external electric circuit, the contact portion is positioned at a decentered position from the coil center of the contact spring, and the contact spring is configured so as to incline in the pin accommodation hole and generate a moment to press a closed coil portion to the conductive portion.

It is preferable for the electric contact pin of the present invention that the electric contact pin according to claim 1, wherein; the closed coil portion of the contact spring has a contact portion to contact with the terminal of the external electric circuit, and the contact portion is positioned at the coil center of the contact spring.

The second aspect of the present invention relates to a socket for electrical parts comprising; the electric contact pin according to the first aspect of the present invention and a socket body that accommodates the electric contact pin.

It is preferable for the socket for electrical parts of the present invention that the socket body comprises; a contact unit that accommodates the electric contact pin, and a socket frame into which the contact unit is set.

Effect of the Present Invention

The electric contact pin according to the present invention is configured so as to contacts the eccentrical portion of the open coil portion provided for the contact spring capable of easily deforming in a radial direction with the conductive portion of the plunger, elastically pinch the conductive portion of the plunger between the eccentrical portion of the open coil portion and the closed coil portion, and anytime contact the eccentrical portion of the open coil portion and the closed coil portion with the conductive portion of the plunger. Consequently, the present invention can certainly contact the plunger with the contact spring and ensure the smooth operation (vertical motion) of the plunger. Therefore, the present invention can execute electrical tests of the electrical parts accurately.

BRIEF DESCRIPTION OF THE DRAWINGS

FIG. 6 (*a*) is a partial cross-sectional view of the contact portion between a contact spring of the probe pin according to the embodiment of the present invention and a print-wiring board, (*b*) is a diagram which looked at (*a*) in the direction according to the symbol F1 (i.e. a bottom view of the contact spring) and (*c*) is a lower side view showing a modified embodiment of the small-diameter portion of the contact spring.

DESCRIPTION OF THE PREFERRED EMBODIMENTS

1. A Comparative Example

Figure 10:
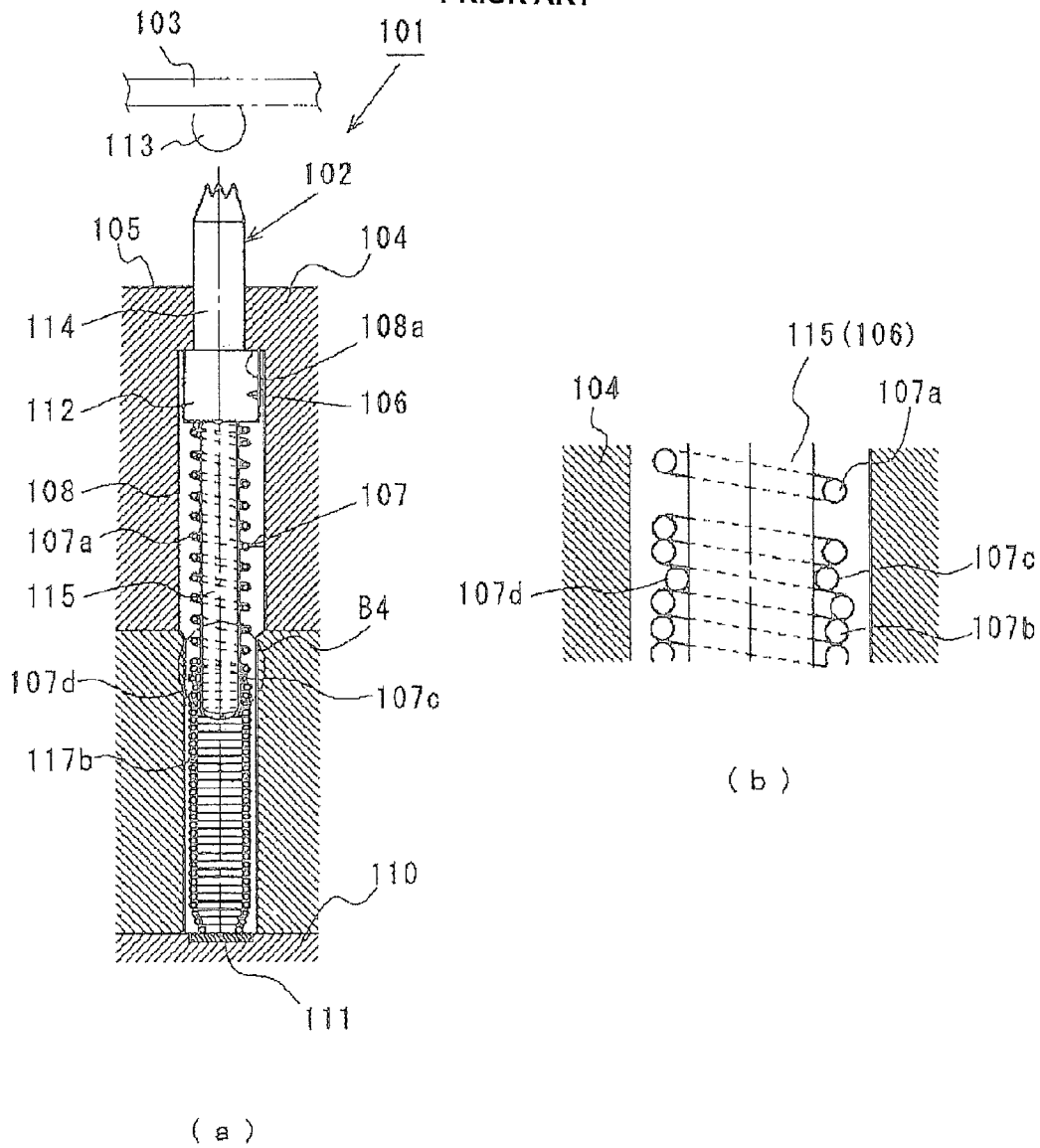
FIG. 10 Each of (*a*) and (*b*) is a partial cross-sectional view showing the probe pin according to a comparative example.

FIG. 10 is a cross-sectional view showing a structure of a prove pin according to a comparative example. In FIG. 10, (*a*) is an overall view and (*b*) is a partial cross-sectional view in an enlarged scale.

The probe pin 102 shown in FIGS. 10 (*a*) and (*b*) is used for a socket for electrical parts 101. FIG. 10(*a*) shows the prove pin 102 before an IC package 103 is accommodated into an IC package accommodation portion 105 of a socket body 104.

The prove pin 102 shown in FIG. 10 is composed of a plunger 106 and a contact spring 107 elastically supporting the plunger 106. The probe pin 102 is accommodated in a pin accommodation hole 108 of the socket body 104, makes the lower terminal of the contact spring 107 to contact with a contact pad 111 of a print-wiring board 110, makes the upper terminal of the contact spring 107 to contact with a flange portion 112 of the plunger 106 and biases the plunger 106 upward at any time using the contact spring 107.

The plunger 106 of the probe pin 102 shown in FIG. 10 is formed so that the terminal contact portion 114 projects upward from the flange portion 112 and contacts with a terminal 113 of the IC package 103, and the conductive portion 115 in the shape of round bar projects downward from the flange portion 112 and contacts with the inner surface of the contact spring 107. Additionally, the plunger 106 is formed so that the upper end of the flange portion 112 is pressed to a step portion 108*a* in the pin accommodation hole 108 by the spring force of the contact spring 107 and thereby the position of the front edge (i.e. the position of the upper end) is set.

The contact spring 107 of the probe pin 102 shown in FIG. 10 comprises an open coil portion 107*a* which works as a compression coil spring, and a closed coil portion 107*b* which does not work as a compression coil spring. In addition, the contact spring 107 is formed so that the closed coil portion 107*b* contains eccentric portions 107*c* and 107*d* made by several number of eccentrically-formed rolls, and the eccentric portions 107*c* and 107*d* contact with the conductive portion 115 of the plunger 106.

The socket for electrical parts provided with the probe pin 102 shown in FIG. 10 is configured so that the terminal 113 of the IC package 103 can electrically connected with the contact pad 111 of the print-wiring board 110 via the plunger 106 and the contact spring 107, both of which are provided for the probe pin 102.

However, concerning the conventional probe pin 102 shown in FIG. 10, the eccentric portions 107*c* and 107*d*, both of which are provided for the closed coil portion 107*b* of the contact spring 107 contacted with the conductive portion 115 of the plunger 106, are difficult to elastically deform in the radial direction in addition not to work as a compression coil spring. Accordingly, there is a possibility that the plunger 106 of the probe pin 102 become not able to do a vertical motion smoothly, because a contact pressure between the eccentric portions 107*c* and 107*d* of the closed coil portion 107*b* of the contact spring 107 and the conductive portion 115 of the plunger 106 becomes too high. Hence the socket 101 for electrical parts provided with the plural number of such probe pins 102 has possibilities that contact pressures with the terminals 113 of the IC package 103 vary widely by each probe pin, as a result, the electric test of the IC package 103 become unreliable, or that some bad connections between the terminals 113 of the IC package 103 and probe pins 102 occur, as a result, the electrical test become to be impossible.

It maybe effective to form a gap or a clearance between the eccentric portions 107*c* and 107*d* of the closed coil portion 107*b* of the contact spring 107 and the conductive portion 115 of the plunger 106, to solve above described problems of the probe pin 102 and the socket 101 for electrical parts provided with the probe pins 102. However, in such case, there is a possibility that the conductive portion 115 of the plunger 106 does not contact with the eccentric portions 107*c* and 107*d* of the closed coil portion 107*b* of the contact spring 107 when the plunger 106 does not decline enough. In such case, when the electric test of the IC package 103 is performed, the resistance value of the probe pin 102 become larger than design value of it, and so the electric test of the IC package 103 become not able to execute accurately.

2. An Embodiment of the Present Invention

Hereinafter, an embodiment of the present invention is described with referencing drawings.

[A Socket for Electrical Parts]

Figure 1:
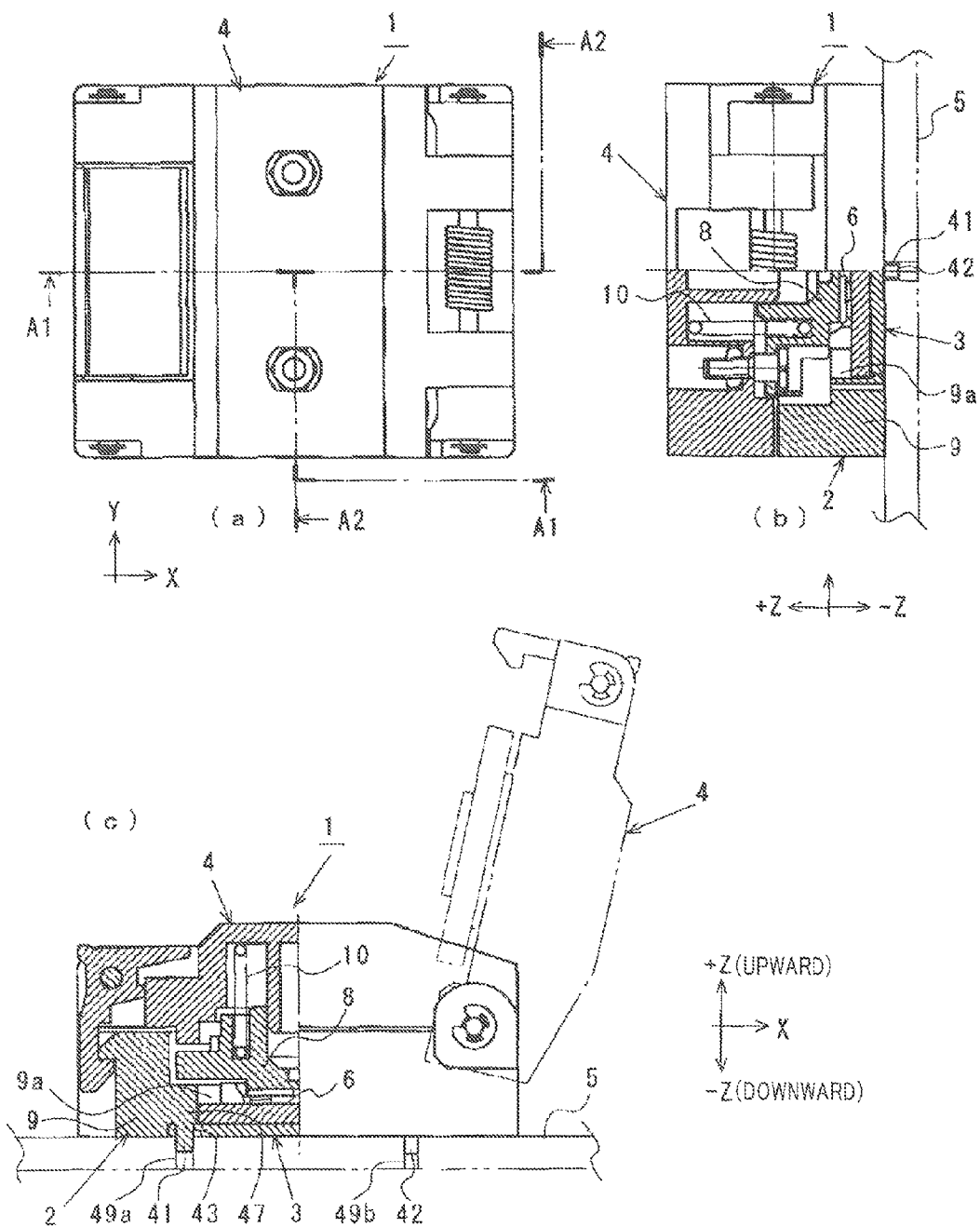
FIG. 1 is a diagram showing a socket for electrical parts according to an embodiment of the present invention: (*a*) is a plain view showing the socket for electrical parts (i.e. a plain view showing a state a socket cover is closed); (*b*) is a front side cross-sectional view of the socket for electrical parts showing a configuration of (*a*) being sectioned along the A1-A1 line; and (*c*) is a right side cross-sectional view of the socket for electrical parts showing a configuration of (*a*) being sectioned along the A2-A2 line.
Figure 2:
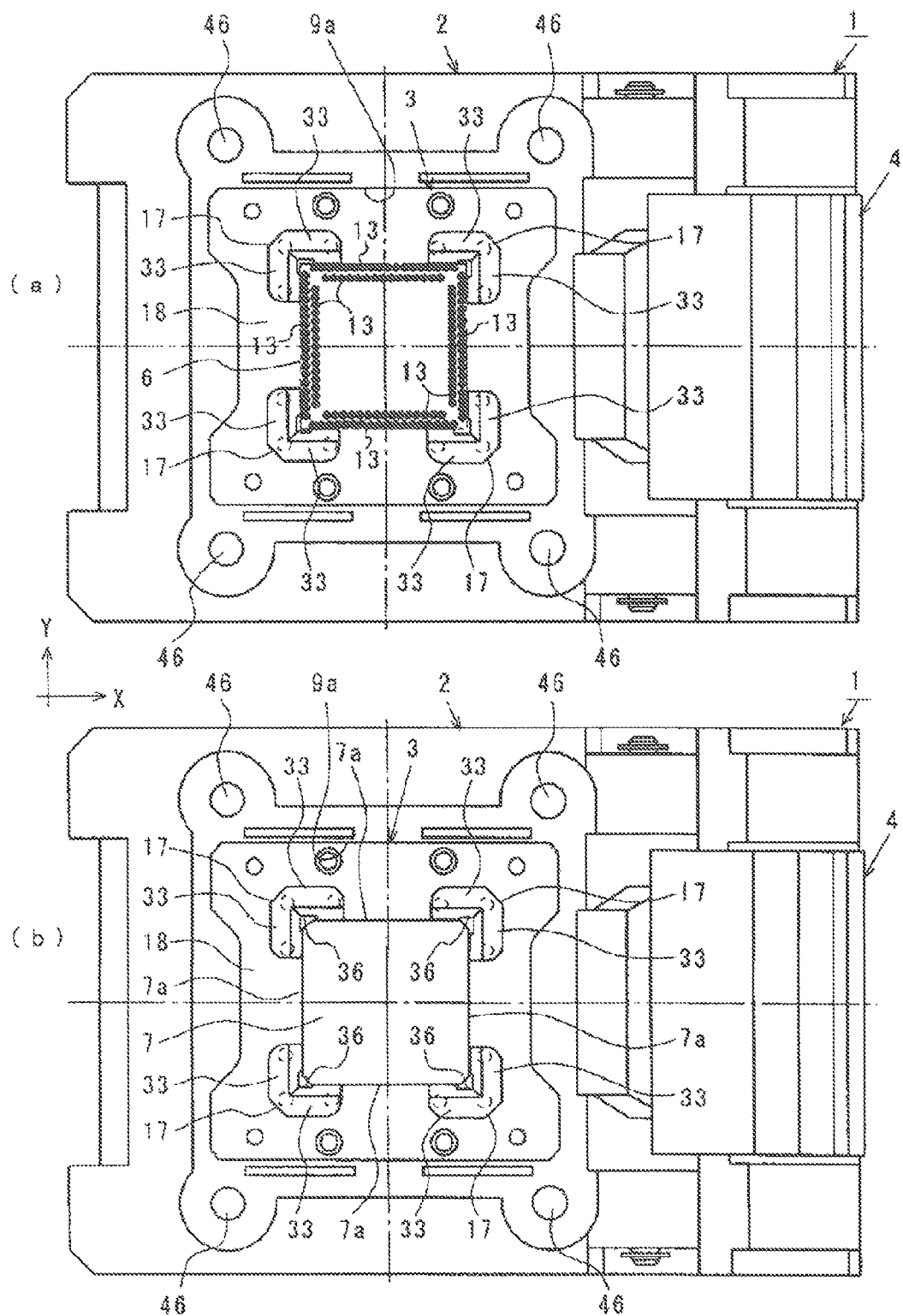
FIG. 2 is a diagram showing the socket for electrical parts according to the embodiment of the present invention under a state the socket cover is opened: (*a*) is a diagram showing a state before accommodating an IC package into an IC package accommodation portion: and (*b*) is a diagram showing a state after accommodating an IC package into an IC package accommodation portion.

FIGS. 1 and 2 shows a socket 1 for electrical parts according to the present embodiment. As shown in these figures, the socket 1 for electrical parts comprises a socket body 2 and a socket cover 4 mounted on the upper side of the socket body 2 so as to be openable and closable. The socket body 2 comprises a socket frame 9 and a contact unit 3 set in a unit mount portion 9a of the socket frame 9 (refer to FIG. 3). The socket 1 for electrical parts of such structure is mounted on the print-wiring board (i.e. external electric circuit) 5.

Figure 4:
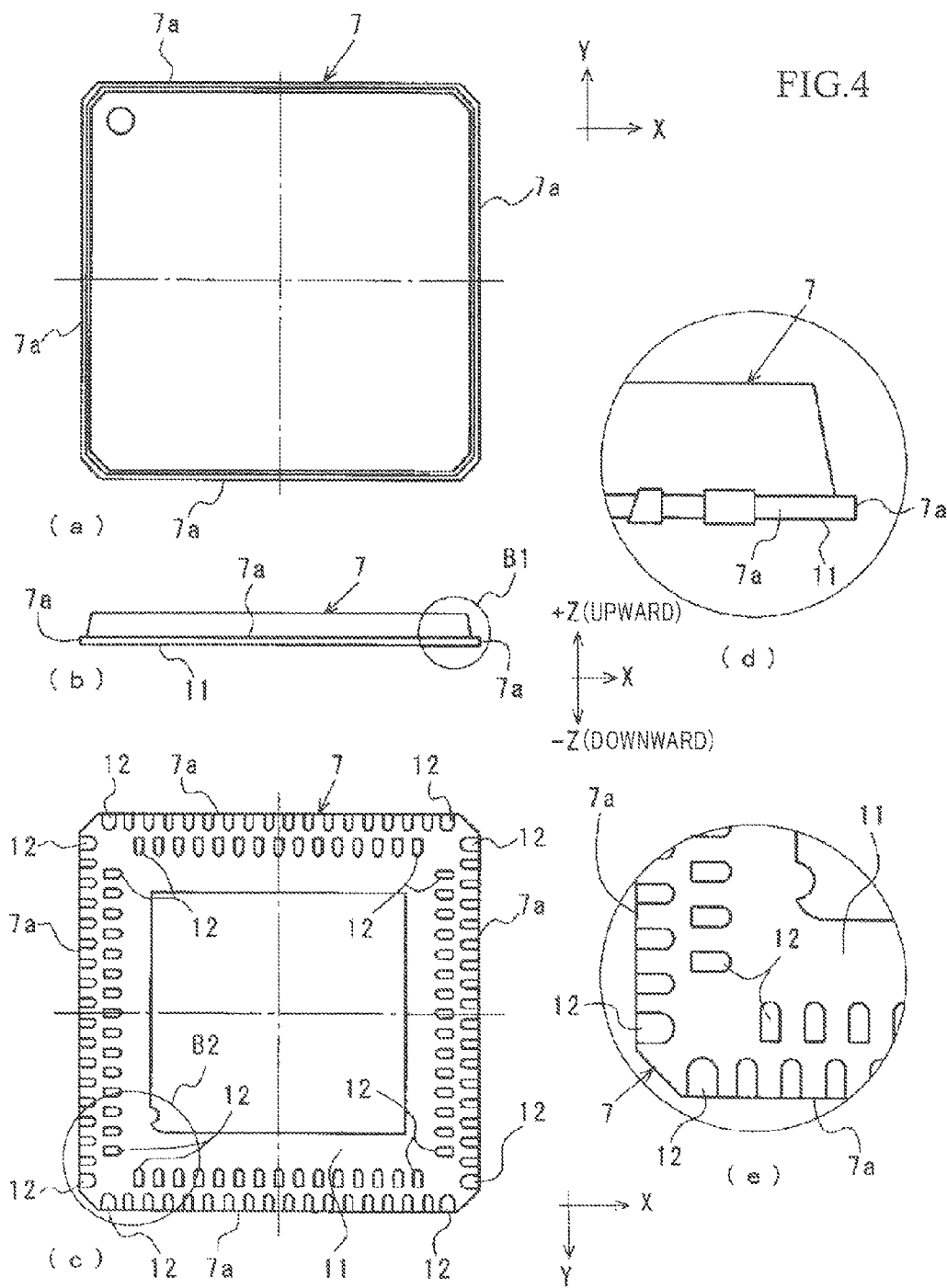
FIG. 4 is a diagram showing an IC package as the electrical part: (*a*) is a plain view of the IC package; (*b*) is a front elevational view of the IC package; (*c*) is a backside view (i.e. lower side view) of the IC package; and (*d*) is an enlarged view showing a part according to the symbol B1 of (*b*); (*e*) is an enlarged view showing a part according to the symbol B2 of (*c*).

Moreover, the socket 1 for electrical parts shown in FIGS. 1 and 2 can accommodate the IC package 7 (refer to FIG. 4) as an electrical part on the IC package accommodation portion 6 of the contact unit 3 under the state the socket cover 4 is opened (refer the state drawn by chain double-dashed lines on FIG. 1(b) and the state drawn on FIG. 2) and can take out the IC package 7 accommodated in the IC package accommodation portion 6 of the contact unit 3.

Furthermore, the socket 1 for electrical parts shown in FIGS. 1 and 2 is configured so that the pressure plate 8 of the socket cover 4 is biased by the spring force of the compression coil spring 10 when the socket cover 7 is closed under the state the IC package 7 is accommodated in the IC package accommodation portion 6. Then, the pressure plate 8, which is biased by the spring force of the compression coil spring 10, presses the terminals 12 of the reverse surface 11 of the IC package 7 against the top edge (i.e. upper end) of the probe pin 13 of the contact unit 3 (refer to FIG. 3(a), FIGS. 4(c), (e) and FIG. 5(a)). As a result, the IC package 7 is electrically connected with the print-wiring board 5 via the probe pins 13 and so the IC package 7 is electrified via the print-wiring board 5 and the probe pins 13, then the electrical test is executed.

[Contact Unit]

Figure 3:
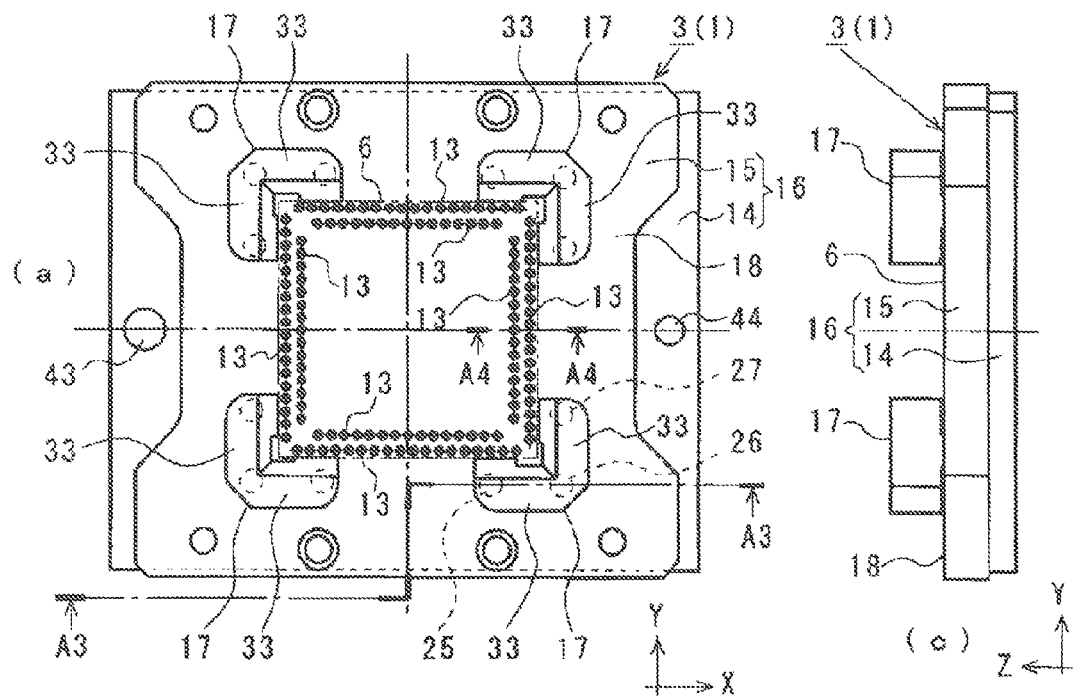
FIG. 3 is a diagram showing a contact unit of the socket for electrical parts according to the embodiment of the present invention: (*a*) is a plain view of the contact unit: (*b*) is a front side cross-sectional view of the contact unit of (*a*) being sectioned along the A3-A3 line; and (*c*) is a right side elevational view of the contact unit.

FIG. 3 shows the contact unit 3 of the socket 1 for electrical parts according to the present embodiment. The contact unit 3 according to the present embodiment is described in detail with referencing FIG. 3 and other drawings noted in the description.

(Plate Assembly)

The contact unit 3 of the socket 1 for electrical parts according to the present embodiment comprises a plate assembly 16 which is configured by lapping a second plate 15 over a first plate 14. The first plate 14 and the second plates 15 are fixed each other using four package guides 17. On the upper surface 18 of the plate assembly 16 (that is, on the upper surface of the second plate 15), the IC package accommodation portion 6, which accommodates the IC package 7 removably under a state the IC package 7 is positioned along X-direction and Y-direction (that is, the direction along the upper surface 18 of the plate assembly 16), is provided. The IC package accommodation portion 6 is the area of rectangular shape in planar view formed on the inner side of the four package guides 17 fixed on the upper surface 18 of the plate assembly 16. The first plate 14 and the second plate 15 are made from insulating resin material such as glass epoxy resin. And the package guides 17 are made from resin material such as Polyethersulfone (PES).

Figure 5:
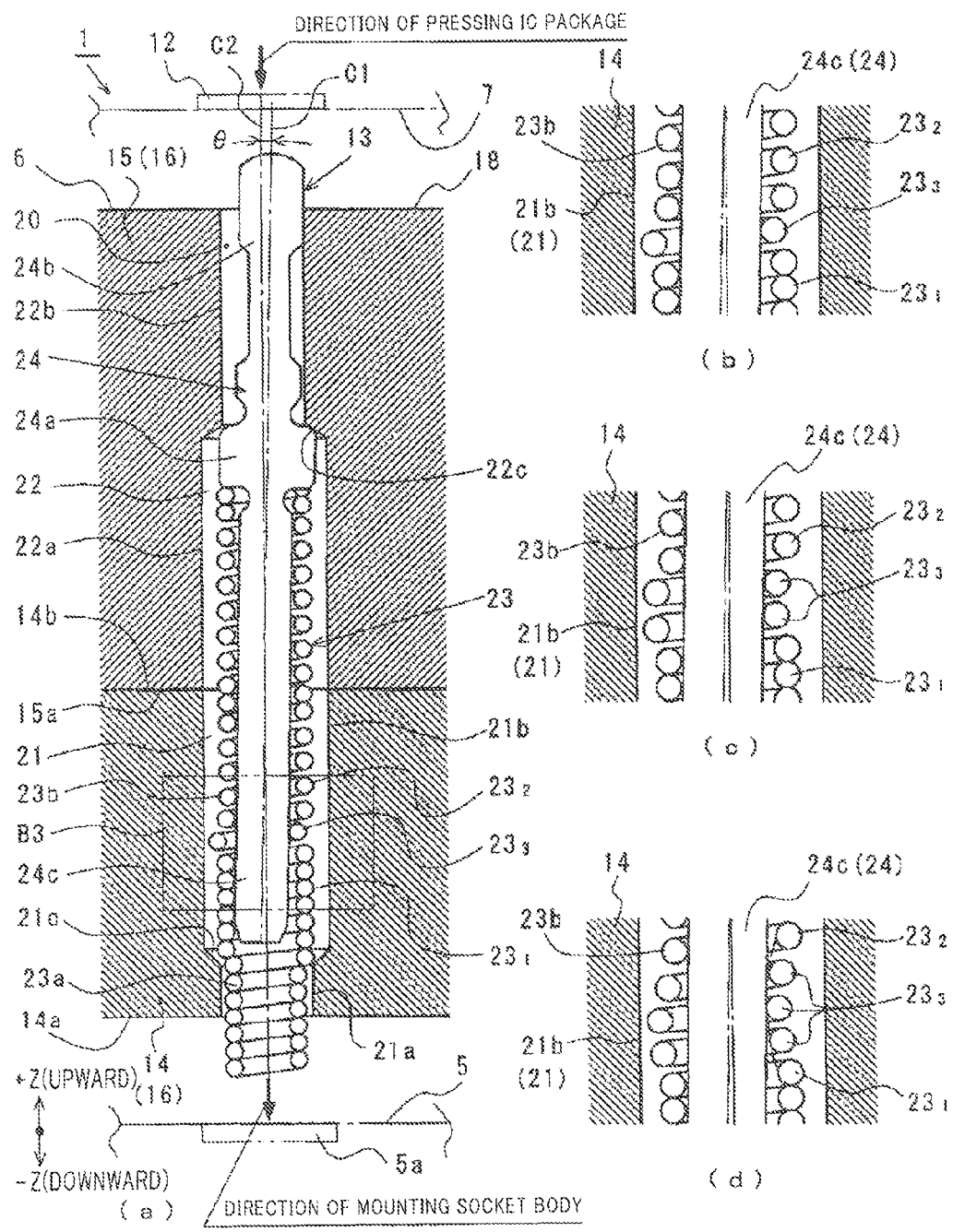
FIG. 5 (*a*) is cross-sectional view, in an enlarged scale, of the contact unit showing a configuration of FIG. 3(*a*) being sectioned along the A4-A4 line, (*b*) is an enlarged view showing a part according to the symbol B3, (*c*) is a diagram showing first modified embodiment of a probe pin and (*d*) is a diagram showing second modified embodiment of the probe pin.

The plate assembly 16 comprises pin accommodation holes 20 formed in the area corresponding to the IC package accommodation portion 6, and the probe pins 13 are accommodated in the pin accommodation holes 20 (refer to FIG. 5(a)). The pin accommodation holes 20 are formed so as to have one-on-one relationships with the same number of the terminals 12 of the IC package 7 (refer to FIG. 4). Each of pin accommodation holes 20 consists of a first pin accommodation hole 21 formed in the first plate 14 and a second pin accommodation hole 22 formed in the second plate 15 (refer to FIG. 5(a)).

As shown in FIG. 5(a), the first pin accommodation hole 21 consists of a small-diameter portion 21a having an opening at the side of the lower surface 14a of the first plate 14 and a large-diameter portion 21b, the diameter of which is larger than that of the small-diameter portion 21a, having an opening at the side of the upper surface 14b of the first plate 14. The small-diameter portion 21a of the first pin accommodation hole 21 accommodates a small-diameter portion 23a of the contact spring 23 provided for the probe pin 13 so as to project downward from the lower surface 14a of the first plate 14. The large-diameter portion 21b of the first pin accommodation hole 21 accommodates a large-diameter portion 23b of the contact spring 23 provided for the probe pin 13 and a conductive portion 24c of the plunger 24 provided for the probe pin 13.

In addition, as shown in FIG. 5(a), the second pin accommodation hole 22 consists of a large-diameter portion 22a having an opening at the side of the lower surface 15a of the second plate 15 and a small-diameter portion 22b, the diameter of which is smaller than that of the large-diameter portion 22b, having an opening at the side of the upper surface 18 of the second plate 15. The large-diameter portion 22a of the second pin accommodation hole 22 accommodates the large-diameter portion 23b of the contact spring 23 provided for the probe pin 13. Furthermore the large-diameter portion 22a accommodates a flange portion 24a which contacts with the top of large-diameter portion 23b of the contact spring 23 and a part of a conductive portion 24c of the plunger 24 so as to be capable of vertical motion (i.e. sliding motion) of them. The small-diameter portion 22b of the second pin accommodation hole 22 accommodates a terminal contact portion 24b of the plunger 24 so as to be capable of vertical motion (i.e. sliding motion).

Figure 7:
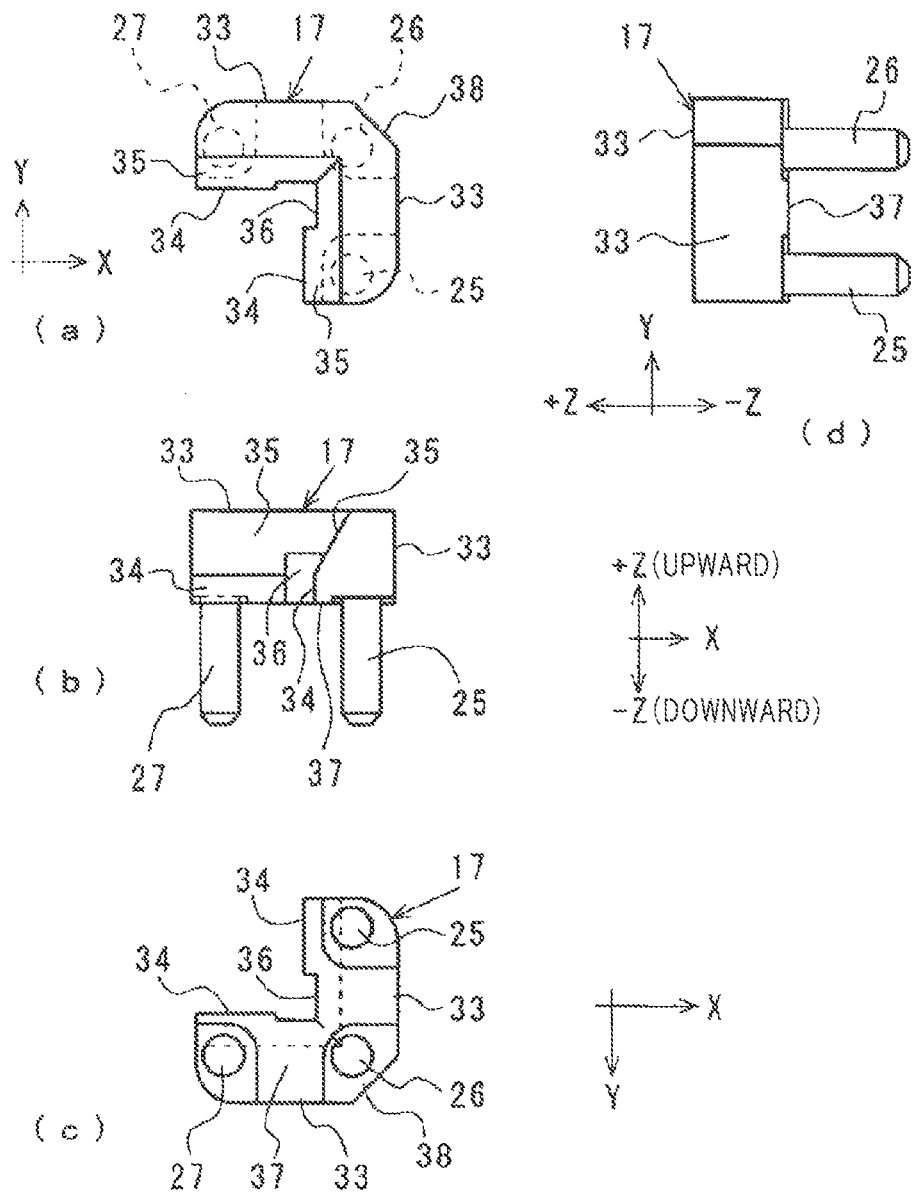
FIG. 7 is a diagram showing a package guide of the contact unit: (*a*) is a plain view of the package guide: (*b*) is a front elevational view of the package guide; (*c*) is a back side view of the package guide; and (*d*) is a right side elevational view of the package guide.
Figure 8:
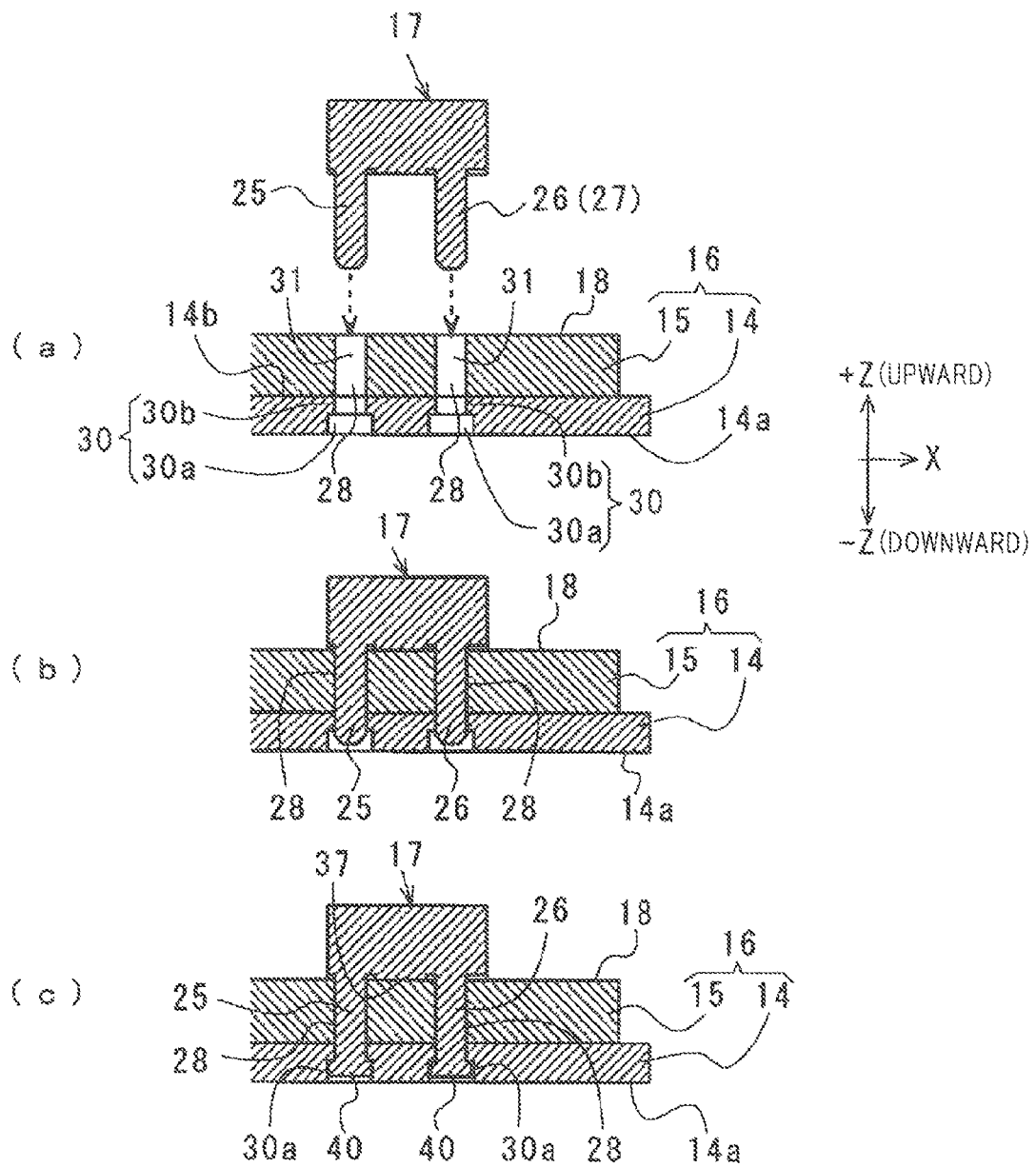
FIG. 8 is a partial cross-sectional view showing a manufacturing processing of the contact unit: (*a*) is a first process drawing of the contact unit; (*b*) is a second process drawing of the contact unit; and (*c*) is a third process drawing of the contact unit.

As shown in FIGS. 3, 7 and 8, the plate assembly 16 comprises fitting pin engagement holes 28, into which fitting pins 25 to 27 of the package guide 17 are inserted. The number of the fitting pin engagement holes 28 is equal to that of the fitting pins 25 to 27. Each fitting pin engagement hole 28 consists of a first fitting pin engagement hole 30 formed in the first plate 14 and a second fitting pin engagement hole 31 formed in the second plate 15. The first pin engagement hole 30 comprises a large-diameter portion 30a having an opening at the lower surface 14a of the first plate 14 and a small-diameter portion 30b having an opening at the upper surface 14b of the first plate 14. The second fitting pin engagement hole 31 is formed so as to have the same diameter as that of the small-diameter portion 30b of the first fitting pin engagement hole 30, has openings at a lower surface 15a and an upper surface 18 of the second plate 15, and is formed so as to be concentric with the small-diameter portion 30b of the first fitting pin engagement hole 30.

(Probe Pin)

As shown in FIG. 5(a), the probe pin 13 comprises a contact spring 23 and a plunger 24 which is biased by the contact spring 23, and thereby, contacts with the terminal 12 of the IC package 7. The contact spring 23 is a spring having a shape of a coil and is formed from stainless steel (i.e. SUS) and so on. The plunger 24 is formed from brass (i.e. BS) and so on.

As shown in FIGS. 5(a) and (b), the contact spring 23 comprises the small-diameter portion 23a, which is fitted into the small-diameter portion 21a of the first pin accommodation hole 21 under the state the portions 23a and 21a are separated by a gap, and the large-diameter portion 23b, the diameter of which is larger than that of the small-diameter portion 21a of the first pin accommodation hole 21 and is fitted into the large-diameter portion 21b of the first pin accommodation hole 21 under the state the portions 23b and 21b are separated by a gap. The contact spring 23 contains a closed coil portion $23_1$ which is formed by lowest several rolls of the large-diameter portion 23b (that is, several rolls adjacent to the small-diameter portion 23a) and the small-diameter portion 23b, and does not work as a compression coil spring. Furthermore, the contact spring 23 contains a open coil portion $23_2$ which is formed by other portion of the contact spring 23, and works as a compression coil spring. Lowest single roll of the open coil portion $23_2$ (that is, single roll adjacent to the closed coil portion $23_1$) is formed eccentrically, and the eccentrically formed portion of the open coil portion $23_2$ (hereinafter, the eccentrical portion $23_3$) can be easily bended or deformed in a radial direction (that is, in a direction perpendicular to the coil center C3 shown in FIG. 6), and thereby the eccentrical portion $23_3$ elastically contacts with the conductive portion 24c of the plunger 24. In addition, the eccentrical portion $23_3$ of the open coil portion $23_2$ is formed so as to press the end of the conductive portion 24c of the plunger 24 against the inner surface of the closed coil portion $23_1$. Moreover, the contact spring 23 is formed so that a part of the small-diameter portion 23a projects downward from the small-diameter portion 21a of the first pin accommodation hole 21 before the socket body 2 does not fixed on the print-wiring board 5. The diameter of the large-diameter portion 23b of the contact spring 23 is larger than that of the small-diameter portion 23a of the first pin accommodation hole 21, so the lower end of the large-diameter portion 23b is caught in the split level portion 21c formed between the small-diameter portion 21a and the large-diameter portion 21c of the first pin accommodation hole 21. As a result, the contact spring 23 is not left out from the first pin accommodation hole 21 and the projecting length of the contact spring 23 is regulated.

As shown in FIG. 5(c), the force of spring (that is, the suppress strength against the conductive portion 24c of the plunger 24) can be increased if constructing the eccentrical portion $23_3$ by plural (i.e. two or more) rolls of the open coil portion $23_2$ in which the eccentrical measurements of each eccentrical roll are the same. The eccentrical portion $23_3$ shown in FIG. 5(c) is formed by two rolls of the open coil $23_2$, each of which have the same eccentrical measurements, however, the present invention is not limited to such example and can employ the eccentrical portions formed by three or more rolls of the open coil $23_2$, each of which have the same eccentrical measurements.

In addition, as shown in FIG. 5(d), the force of spring (that is, the suppress strength against the conductive portion 24c of the plunger 24) can be increased if constructing the eccentrical portion $23_3$ by plural (i.e. two or more) rolls of the open coil portion $23_2$ in which the eccentrical measurements increase gradually by each eccentrical roll. The eccentrical portion $23_3$ shown in FIG. 5(d) comprises three rolls of the open coil $23_2$ in which the eccentrical measurements increase gradually by each eccentrical roll, and other rolls of the eccentrical portion $23_3$ are formed so that the eccentrical measurements decrease gradually by each eccentrical roll, however, the present invention is not limited to such example and can employ an eccentrical portion $23_3$ comprising two rolls of which the eccentrical measurements increase gradually by each eccentrical roll or an eccentrical portion $23_3$ comprising three or more rolls in which the eccentrical measurements increase gradually by each eccentrical roll.

FIG. 6(a) is a cross-sectional view showing a condition of contact between the lower end (i.e. front edge) of the small-diameter portion 23a of the contact spring 23 and a contact pad 5a of the print-wiring board 5. FIG. 6(c) is a bottom view showing the small-diameter portion 23a of the contact spring 23 from direction of arrowed line F1 of FIG. 6(a). As shown in these Figures, the position P1, which is the contact point between the small-diameter portion 23a of the contact spring 23 and a contact pad 5a of the print-wiring board 5, is decentered from the coil center C3 of the contact spring 23. Additionally, the position P1, which is the contact point between the small-diameter portion 23a of the contact spring 23 and a contact pad 5a of the print-wiring board 5, is rotated 180 degree from the contact position P2, which is the contact point between the eccentrical portion $23_3$ of the contact spring 23 and the conductive portion 24c of the plunger 24, along a coil circumference (that is, a circumference of a virtual circle, center of which is the coil center C3). As a result, as shown in FIG. 6(a), the contact spring 23 falls dawn in the pin accommodation hole 20 by the operation of the moment M in a clockwise direction around the contact position P1 between the small-diameter portion 23a and the contact pad 5a. Thereby, the closed coil portion $23_1$ presses the front end of the conductive portion 24c, then the inclining of the plunger 24 become able to be remedied (that is, the inclined angle θ become able to be reduced). The inclining of the contact spring 23 can be effectively prevented by conforming the contact position P1, which is the contact point between the small-diameter portion 23a of the contact spring 23 and the contact pad 5a of the print-wiring board 5, to the coil center C3, as shown in FIG. 6(c).

As shown in FIG. 5(a), the plunger 24 integrally comprises the flange portion 24a which is biased upward by the contact spring 23 at any time, the terminal contact portion 24b which extends from the top end surface (that is, one of end surfaces) of the flange portion 24a along the central axis C1, and the conductive portion 24c which extends from the lower end surface (that is, the other of end surfaces) of the flange portion 24a along the central axis C1.

As shown in FIG. 5(a), the flange portion 24a of the plunger 24 is configured so as to be able to vertically move (i.e. sliding move) in the large-diameter portion 22a of the second pin accommodation hole 22 under the state of elastically supported by the contact spring 23. Under the state that the terminal contact portion 24b does not pressed into the second pin accommodation hole 22 by the IC package 7, the flange portion 24a of the plunger 24 is pressed to the uneven portion 22c between the large-diameter portion 22a and the small-diameter portion 22b of the second pin accommodation hole 22 by the spring force of the contact spring 23, as a result, the top end of the terminal contact portion 24b is positioned and thereby the length of the terminal contact portion 24b projected from the upper surface 18 of the plate assembly 16 is regulated. The terminal contact portion 24b of the plunger 24 is formed so that the shape of the top end, which projects from the pin accommodation hole 20, is a part of sphere, as a result, the top end can certainly contact with the terminal 12 of the IC package 7 under a state the plunger 24 inclines in the pin accommodation hole 20 (that is, a state the central axis C1 of the plunger 24 inclines angle θ to the center line C2 of the pin accommodation hole 20). The conductive portion 24c of the plunger 24 is inserted into the internal space of the contact spring 23 and pushed in a radial direction by the eccentrical portion $23_3$ of the contact spring 23. At that time, the spring force of the contact spring 23 presses the flange portion 24a of the plunger 24 to the uneven portion 22c between large-diameter portion 22a and the small-diameter portion 22b of the second pin accommodation hole 22, and so the plunger inclines angle θ around the rotation center, that is, contact point between the flange portion 24a of the plunger 24 and the uneven portion 22c. Consequently, the top end of the conductive portion 24c of the plunger 24 is pressed to the inner surface of the closed coil portion 23i, and thereby the conductive portion 24c is elastically held by being pinched between the eccentrical portion $23_3$ and the open coil portion $23_2$ of the contact spring 23, therefore, the conductive portion 24c and can vertically move (or slide) with rubbing over the eccentrical portion $23_3$ and the closed coil portion $23_1$. Consequently, the plunger 24 and the contact spring 23 certainly contacts at all times, as a result, it become possible to electrically connect the terminal 12 of the IC package 7 with the contact pad 5a of the print-wiring board 5. Length of the conductive portion 24c of the plunger 24 is designed not to project downward from the lower surface 14a of the first plate 14 under a state whole of the terminal contact portion 24b is pushed into the pin accommodation hole 20. The plunger 24 smoothly slides with contacting the closed coil portion $23_1$ because the corners of the plunger 24 are chamfered.

Above described probe pin 13 is configured so that the small-diameter portion 23a of the contact spring 23 is pushed into the first pin accommodation hole 21, and the top end of the small-diameter portion 23a of the contact spring 23 elastically contact with the contact pad 5a of the print-wiring board 5 certainly by the spring force of the contact spring 23, when the contact unit 3 (a part of the socket body 2) is set onto the print-wiring board 5 (refer to FIGS. 1 and 5(a)). Moreover, the probe pin 13 is configured so that the IC package 7 is accommodated in the IC package accommodation portion 6 of the contact unit 3 (refer to FIG. 2). When the IC package 7 is pressed by the pressure plate 8 of the socket cover 4 (refer to FIG. 1), the terminal contact portion 24b of the plunger 24 contacts with the terminal 12 located on the lower surface 11 of the IC package 7, the flange 24a of the plunger 24 pushes and compresses the contact spring 23, then the terminal contact portion 24b is pressed into the second pin accommodation hole 22 (refer to FIG. 5(a)). In addition, the plunger 24 and the contact spring 23 provided for the probe pin 13 are made from metal material of high conductivity and so the probe pin 13 can electrically contact the terminal 12 of the IC package 7 with the contact pad 5a of the print-wiring board 5 via the plunger 24 and the contact spring 23 contacting with the plunger 24 (refer to FIG. 5(a)).

(Package Guide)

FIG. 7 shows a detail of the package guide 17. The package guides 17 are fitted on the upper surface 18 of the plate assembly 16 so as to guide the IC package 7, shape of which is rectangular in planar view, to the predetermined area of the upper surface 18 of the plate assembly 16, as shown in FIGS. 2(b) and 3. The package guides 17 are located on the positions according to four sides of the IC package 7. Each of the package guides 17 has a pair of side walls 33 and 33 of orthogonal oriented, and each of side walls 33 and 33 is formed so as to parallel to either one of adjacent two side surfaces 7a and 7a of IC package 7. At inner side of these four package guides 17, the IC package accommodation portion 6, which accommodates the IC package 7 removably, is formed. The IC package accommodation portion 6 comprises a flat surface which is slightly larger than the flat surface of the IC package, and the size of which is designed so that the terminals 12 located on the lower surface 11 of the IC package 7 and the probe pins 13 accommodated in the plate assembly 16 opposite one-on-one.

As shown in FIGS. 3 and 7, each of the package guides 17 comprises the positioning surfaces 34 to define the outer edges of the IC package accommodation portion 6 and the inclined surfaces 35 extending obliquely upward from the positioning surfaces 34, both of which are formed at the inner surface of the pair of side walls 33 and 33. The inclined surfaces 35 of the package guide 17 guide the IC package 7 to the IC package accommodation portion 6, then the positioning surfaces 34 of the package guide 17 set the position of the IC package 7 on the upper surface 18 (that is, X-Y flat surface) (refer to FIG. 2(b)). The package guides 17 comprise escape trenches 36 formed at the corners of inner sides of the pair of side walls 33 and 33. The base end surfaces of the escape trenches 36 are formed at recessed positions from the positioning surfaces 34, and so the positioning surfaces 34 can contact with the side surfaces of the IC package 7 (refer to FIG. 2(b)).

Moreover, as shown in FIG. 7, the package guide 17 comprises fitting pins 25 to 27 of round bar shapes which are integrally formed on the top side of the back surface (i.e. lower surface) 37 of the side walls 33, 33 and on the crossing portion 38 of the back surface 37 of the side walls 33, 33. The fitting pins 25 to 27 project downward (i.e. −z axial direction). These three fitting pins 25 to 27 have the same sizes (diameter and length), and slidably engage with the small-diameter holes of the fitting pin engagement holes 28 (e.g. the second fitting pin engagement hole 31, and the small-diameter portion 30b of the first fitting pin engagement hole 30) with slight clearances. The fitting pins 25 to 27 position the first and second plates 14 and 15 on the X-Y plane, and position the package guide 17 on the plate assembly 16 (refer to FIGS. 3 and 8). When three fitting pins 25 to 27 are engaged with the fitting pin engagement holes 28 of the plate assembly 16 (refer to FIGS. 8(a) and (b)), the ends of them, which are engaged with the large-diameter portion 30a of the first fitting pin engagement hole 30 with enough large clearances, are deformed to expand the diameter of them (refer to FIGS. 8(a) to (c)). The deformations for expanding diameters are executed by swaging the end of the fitting pins 25 to 27 in the large-diameter portions 30a of the first fitting pin engagement holes 30, or heating and pressuring the end of the fitting pins 25 to 27 in the large-diameter portions 30a of the first fitting pin engagement holes 30 (refer to FIGS. 8(a) to (c)). The deformed portions 40 of the fitting pins 25 to 27 are accommodated in the large-diameter portions 30a of the first fitting pin engagement holes 30, and do not project downward to the lower surface 14a of the first plate 14 from the large-diameter portions 30a of the first fitting pin engagement holes 30.

As shown in FIG. 8, by engaging the fitting pins 25 to 27 with the fitting pin engagement holes 28 of the plate assembly 16 and deforming the ends of the fitting pins 25 to 27 to expand diameters, the package guide 17 can clamp and fix the first and second plate 14 and 15 under the state of positioned between the lower surface 37 and the deformed portions 40 of the fitting pins 25 to 27, and can be fixed on the plate assembly 16 under the state of positioned (refer to FIG. 3). As a result, the package guide 17 can position the terminals 12 of the IC package 7 in order to correspond to the probe pins 13 with high accuracy.

(Features of Contact Unit)

As shown in FIGS. 1 to 3, the contact unit 3 of above described structure is mounted onto the unit mount portion 9a of the socket frame 9 under the state the positioning pins 41 and 42 of the socket frame 9 are engaged with the positioning holes 43 and 44. Consequently, IC package 7 can be accommodated into the IC package accommodation portion 6 when the socket cover 4 is opened and the upper surface 18 of the second plate 15 is exposed upward.

As shown in FIGS. 1 to 3, after engaging the positioning pins 41, 42 of the socket frame 9 with the positioning holes 43, 44 of the first plate 14 and mounting the contact unit 3 onto the unit mount portion 9a of the socket frame 9, the contact unit 3 is put onto the print-wiring board 5 together with the socket frame 9 and is fixed on the print-wiring board 5 by engaging screws, which are not shown in Figures, with the screw fixing holes 46. Then, the upper surface of the exterior edge of the first plate 14 is pressed to the lower surface of the plate pressing portion 47 of the socket frame 9 by the spring force of the contact spring 23 of the probe pin 13. The contact unit 3 is positioned on the print-wiring board 5 together with the socket frame 9 by engaging the positioning pins 41, 42 of the socket frame 9 with the positioning holes 49a, 49b of the print-wiring board 14 after engaging the positioning pins 41, 42 of the socket frame 9 with the positioning holes 43, 44 of the first plate 14 and mounting the contact unit 3 onto the unit mount portion 9a of the socket frame 9.

Moreover, as shown in FIGS. 1 to 3, when the IC package 7, which is accommodated in the IC package accommodation portion 6, is pressed by the pressure plate 8 of the closed socket cover 4, the plungers 24 of the probe pins 13 are pressed by the IC package 7, then the plungers 24 compress the contact springs 23 and are plunged into the pin accommodation holes 20. At that time, the lower end of the small-diameter portions 23a of the contact springs 23 are pressed toward the contact pad 5a of the print-wiring board 5 by the spring force of the open coil portion $23_2$.

The above described contact unit 3 is fixed under the state the first and second plates 14, 15 are positioned using four package guides 17 made by resin material, so it is unnecessary to fix the first and second plates 14, 15 using metallic screws or other kind of fastening means and/or rivets, as a result, it is unnecessary to reserve spaces for the metallic screws or other kind of fastening means and/or the rivets. Therefore, overall structure can be downsized, weight of overall structure can be reduced and prices of products can fall.

In addition, by using such contact unit 3, the socket for electrical parts can achieve downsizing of the overall structure, reducing of the weight and falling of the price comparing with the case of using metallic screws or other kind of fastening means and/or rivets.

The present embodiment employs the package guide 17 in which three fitting pins 25 to 27 are integrally formed and the first and second plates 14 and 15 are fixed using these three fitting pins 25 to 27, however, other package guide in which plural (i.e. more than two) fitting pins are integrally formed and the first and second plates 14 and 15 are fixed using these plural fitting pins can be employed.

[Effect of the Present Embodiment]

As described above, the probe pin 13 according to the present embodiment is configured so that the eccentrical portion $23_3$ of the open coil portion $23_2$ of the contact spring 23, which can elastically deform in a radial direction easily, contacts elastically with the conductive portion 24c of the plunger 24, the conductive portion 24c of the plunger 24 is elastically pinched between the eccentrical portion $23_3$ of the open coil portion $23_2$ and the closed coil portion $23_1$ and the conductive portion 24c of the plunger 24 is anytime contacted with the eccentrical portion $23_3$ of the open coil portion $23_2$ and the closed coil portion $23_1$. Therefore, the plunger 24 can certainly contact with the contact spring 23 and can smoothly work (vertically move), and so electrical tests of the IC package 7 can be accurately executed.

[Modified Embodiment of the Package Guide]

Figure 9:
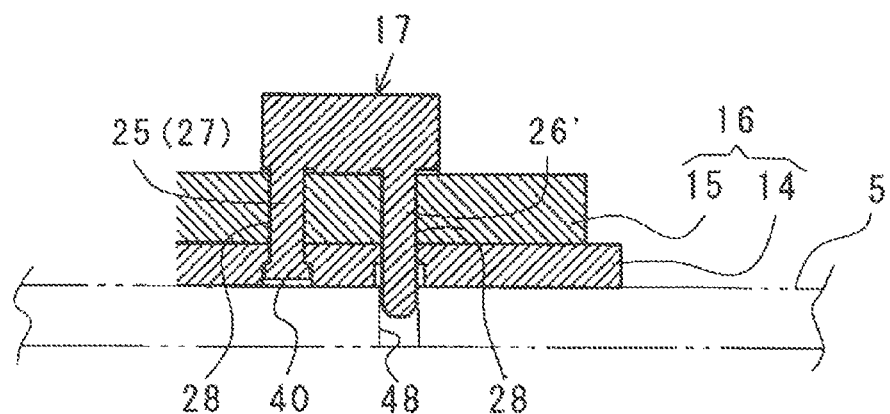
FIG. 9 is a partial cross-sectional view showing the contact unit according to a modified embodiment of the package guide.

FIG. 9 shows a modified embodiment of the package guide 17 and corresponds to FIG. 8(b). The package guide 17 shown in FIG. 9 comprises a positioning pin 26' which corresponds to the fitting pin 26 of the package guide 17 shown in FIG. 7, but length of which is longer than that of other two fitting pins 25, 27. The positioning pin 26' is formed so as to project downward from the first plate 14 and is not deformed for expanding diameter. And the positioning pin 26' projecting from the first plate 14 is engaged with the positioning hole 48 of the print-wiring board 5.

By using such package guide 17, the contact unit 3 can be accurately positioned on the print-wiring board 5 by engaging the positioning pin 26' of the package guide 17 with the positioning hole 48 of the print-wiring board 5. As a result, the contact unit 3 using the package guide 17 according to the present modified embodiment needs not to comprise any positioning means for positioning the contact unit 3 toward the print-wiring board 5 and so overall structure of it can be simplified.

The package guide 17 according to the present modified embodiment comprises the positioning pin 26' instead of the fitting pin 26 of the package guide 17 shown in FIG. 7, however, the positioning pin for engaging with the positioning hole 48 of the print-wiring board 5 can be formed instead of anyone of fitting pins 25 to 27 of the package guide 17 shown in FIG. 7.

[Modified Embodiment of the Socket for Electrical Parts]

The contact unit 3 accommodating the probe 13 of the present invention can be applied not only to the socket 1 for electrical parts of clamshell type, but can be applied to the socket for electrical parts of the open-top type.

Moreover, the probe 13 according to the present invention can be applied not only to the probe accommodated in the contact unit 3, but can be applied to the probe accommodated in the socket body in which the contact unit 3 and socket frame 9 are integrally formed.

DESCRIPTIONS OF REFERENCE SYMBOLS

1; socket for electrical parts
2; socket body
3; contact unit
5; print-wiring board (external electrical test circuit)
5a; contact pad
7; IC package
9; socket frame
12; terminal
13; probe pin
20; pin accommodation hole
23; contact spring
$23_1$; closed coil portion
$23_2$; open coil portion
$23_3$; eccentrical portion
24; plunger
24a; flange portion
24b; terminal contact portion
24c; conductive portion
C1; central axis

What is claimed is:

1. An electric contact pin accommodated in a socket for electrical parts to electrically connect a terminal of an electrical part with a terminal of an external electric circuit, comprising:
 a contact spring that is in a shape of a coil and is contacted with the terminal of the external electric circuit; and
 a plunger that is biased by the contact spring to contact with the terminal of the electrical part,
 wherein the contact spring comprises:
  a closed coil portion, in which adjacent rolls contact one another without a gap therebetween, that contacts with the terminal of the external electric circuit, and
  an open coil portion, in which adjacent rolls face one another with a gag therebetween, that elastically supports the plunger,
 the plunger comprises
  a flange portion that is configured so as to slide in a pin accommodation hole under a state the plunger is elastically supported by the contact spring,
  a terminal contact portion that extends from the one end surface of the flange portion, project to an outside of the pin accommodation hole and contact a top end of itself with the terminal of the electrical part, and
  a conductive portion that is in a shape of a rod and extends from the other end surface of the flange portion to be inserted into an inner side of the contact spring,
 the open coil portion comprises an eccentrical portion having at least one eccentrical roll, and
 the eccentrical portion of the open coil portion and the closed coil portion are configured so as to elastically pinch the conductive portion of the plunger in a radial direction of the plunger and anytime contact with the conductive portion of the plunger.

2. The electric contact pin according to claim 1, wherein the eccentrical portion of the contact spring contains plural eccentrical rolls and eccentrical measurements of the eccentrical rolls increase gradually by each roll.

3. The electric contact pin according to claim 1, wherein
 the closed coil portion of the contact spring has a contact portion to contact with the terminal of the external electric circuit,
 the contact portion is positioned at a decentered position from the coil center of the contact spring, and
 the contact spring is configured so as to incline in the pin accommodation hole and generate a moment to press a closed coil portion to the conductive portion.

4. The electric contact pin according to claim 1, wherein
 the closed coil portion of the contact spring has a contact portion to contact with the terminal of the external electric circuit, and
 the contact portion is positioned at the coil center of the contact spring.

5. A socket for electrical parts comprising:
 the electric contact pin according to claim 1; and
 a socket body that accommodates the electric contact pin.

6. The socket for electrical parts according to claim 5, wherein the socket body comprises:
 a contact unit that accommodates the electric contact pin; and
 a socket frame into which the contact unit is set.

7. An electric contact pin, comprising:
 a contact spring that is in a shape of a coil and is contacted with a terminal of an external electric circuit; and
 a plunger that is biased by the contact spring to contact with a terminal of an electrical part, wherein the contact spring comprises:
  a closed coil portion having adjacent rolls that contact one another without a gap therebetween, the closed coil portion contacting with the terminal of the external electric circuit, and
  an open coil portion having adjacent rolls that face one another with a gap therebetween, the open coil portion including at least one eccentrical roll, the open coil portion elastically supporting the plunger.

* * * * *

UNITED STATES PATENT AND TRADEMARK OFFICE
CERTIFICATE OF CORRECTION

PATENT NO. : 9,048,556 B2  
APPLICATION NO. : 13/983735  
DATED : June 2, 2015  
INVENTOR(S) : Takashi Morinari It is certified that error appears in the above-identified patent and that said Letters Patent is hereby corrected as shown below:

Title Page, item 73 (Assignee), Line 1:

Delete "EMPLAS" and insert --ENPLAS--, therefor.

Signed and Sealed this
Thirteenth Day of October, 2015

Michelle K. Lee
*Director of the United States Patent and Trademark Office*